United States Patent
Ueda et al.

(10) Patent No.: US 6,780,561 B2
(45) Date of Patent: Aug. 24, 2004

(54) POLYBENZOXAZOLE PRECURSOR AND COATING COMPOSITION USING THE SAME

(75) Inventors: Mitsuru Ueda, Tokyo (JP); Kazuya Ebara, Tokyo (JP); Kenji Miyagawa, Hiratsuka (JP); Kazuo Yamanaka, Hiratsuka (JP); Yoichi Yonehara, Chigasaki (JP)

(73) Assignee: Kansai Paint Co., Ltd., Hyogo-ken (JP)

( * ) Notice: Subject to any disclaimer, the term of this patent is extended or adjusted under 35 U.S.C. 154(b) by 0 days.

(21) Appl. No.: 10/303,988

(22) Filed: Nov. 26, 2002

(65) Prior Publication Data

US 2003/0143480 A1 Jul. 31, 2003

(30) Foreign Application Priority Data

Nov. 26, 2001 (JP) ........................................ 2001-359242

(51) Int. Cl.⁷ ............................. G03F 7/023; G03F 7/30
(52) U.S. Cl. ...................... 430/189; 430/191; 430/192; 430/193; 430/326
(58) Field of Search ................................ 430/189, 191, 430/192, 193, 326, 330; 528/266, 344, 346, 341, 347

(56) References Cited

U.S. PATENT DOCUMENTS 6,207,356 B1 * 3/2001 Banba et al. ................ 430/326
6,297,351 B1 * 10/2001 Murayama et al. .......... 528/401
6,376,151 B1 * 4/2002 Takahashi et al. ........... 430/192
6,524,764 B1 * 2/2003 Tomikawa et al. .......... 430/191

FOREIGN PATENT DOCUMENTS

| JP | 3220234 | 9/1991 |
| JP | 4-202528 | 7/1992 |
| JP | 2003-156844 | 5/2003 |

* cited by examiner

Primary Examiner—John S. Chu
(74) Attorney, Agent, or Firm—Wenderoth, Lind & Ponack, LLP

(57) ABSTRACT

Provided is a polybenzoxazole precursor having a high purity which does not contain ionic by-products. The above polybenzoxazole precursor comprises a repetitive unit represented by Formula (1):

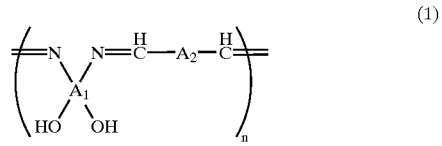

wherein $A_1$ represents a tetravalent aromatic group; N and OH which are bonded to $A_1$ are paired, and the respective pairs of N and OH are bonded to carbons which are adjacent to each other on the same aromatic ring; $A_2$ represents a divalent organic group; and n represents a number of 2 to 300.

6 Claims, 6 Drawing Sheets

POLYBENZOXAZOLE PRECURSOR AND COATING COMPOSITION USING THE SAME

The present invention relates to a polybenzoxazole precursor and a production process for the same. Also, the present invention relates to a coating composition capable of forming a film which is excellent in an electrical insulating property, a heat resistance and a mechanical strength and which is useful particularly as a protective film or an insulating film for a semiconductor element or a circuit board such as a printed board.

Further, the present invention relates to a positive type light-sensitive resin composition suited as a resist which is excellent in an operation stability and highly reliable for forming a conductor image, particularly an etching resist for producing a printed wiring board and to a method for forming a pattern using the same resin composition.

A polyimide resin which is excellent in thermal and mechanical characteristics has so far been used as a film organic material for protecting and insulating a semiconductor element or a circuit board such as a printed board.

Further, in recent years, a light-sensitive polyimide resin which is excellent in a heat resistance and mechanical characteristics is being used as an organic material for the purpose of forming a circuit pattern on a semiconductor element or an electronic or electric circuit board such as a printed board and protecting and insulating it. In such light-sensitive polyimide resin composition, negative type ones in which an exposed part is cured and insolubilized are disclosed in many documents including Japanese Patent Publication No. 030207/1980 (=DE-A-2437413) and Japanese Patent Application Laid-Open No. 145794/1979 (=U.S. Pat. No. 4,243,743). However, negative type light-sensitive polyimide resin compositions have problems on a sensitivity, a resolution and a processability, and positive type light-sensitive polyimide resin compositions are disclosed in Japanese Patent Application Laid-Open No. 324493/1994, Japanese Patent Application Laid-Open No. 179604/1995 and Japanese Patent Application Laid-Open No. 143980/2000 for the purpose of improving them.

In general, however, polyimide resins are highly hygroscopic and have a problem in terms of electrical characteristics. Particularly in recent years, fined circuits and accelerated signals make it impossible for them to sufficiently meet required electrical characteristics.

On the other hand, a polybenzoxazole resin is excellent in an electric insulating property as well as a heat resistance and a mechanical strength and therefore is expected as sufficiently applicable to uses in which electronic equipments proceeds to a higher density and a higher performance in the future. A film of the polybenzoxazole resin has a high heat resistance, excellent electrical characteristics and fine processability, and therefore investigated is availability thereof not only for wafer coating but also as an interlayer insulating resin.

For example, positive type light-sensitive resins constituted from polybenzoxazole precursors and diazoquinone compounds are disclosed in Japanese Patent Publication No. 46862/1999 (=U.S. Pat. No. 4,339,521) and Japanese Patent Application Laid-Open No. 281441/1995. The polybenzoxazole precursors used for them are usually produced by reacting dicarboxylic chloride with suitable bis-o-aminophenol (EP-A-0264678 and EP-A-0291779). However, hydrogen chloride (HCl) is produced in these reactions, and therefore soluble bases such as pyridine and ethylamine have to be usually added in order to scavenge it. If chlorides formed from them remain in the product, they are likely to exert an adverse effect on a semiconductor element and an electronic or electric circuit, so that they have to be completely removed by, for example, ion exchangers. However, it is difficult to obtain a polybenzoxazole precursor having a high purity by the method described above, and labor is required for refining it and allows the cost to go up.

Then, disclosed in Japanese Patent Application Laid-Open No. 183846/1997 (=EP-A-761718, U.S. Pat. No. 5,807,969) is a process for producing a polybenzoxazole precursor via a dicarboxylic acid derivative obtained by reacting 1-hydroxybenzotriazole with dicarboxylic acid. However, carbodiimide has to be usually used as a condensing agent for producing the above dicarboxylic acid derivative, and a urea compound is produced as a by-product. Accordingly, a refining step for removing this urea compound is required as well in this process, and a polybenzoxazole precursor having a high purity can not readily be obtained.

An object of the present invention is to provide a novel polybenzoxazole precursor having a high purity which does not contain ionic by-products exerting an adverse effect on the electric characteristics.

Another object of the present invention is to provide a production process for such polybenzoxazole precursor.

A different object of the present invention is to provide a coating composition capable of forming a film which is excellent in an electrical insulating property, a heat resistance and a mechanical strength and which is useful particularly as a protective film or an insulating film for a semiconductor element or a circuit board such as a printed board.

A further different object of the present invention is to provide a positive type light-sensitive resin composition which does not contain impurities such as chlorides exerting an adverse effect on a semiconductor element and an electronic or electric circuit and is inexpensive and excellent in a heat resistance, mechanical characteristics and electrical characteristics and which can form a high resolution circuit pattern.

Intensive researches repeated by the present inventors in order to achieve the objects described above have resulted in finding that a novel polybenzoxazole precursor having a high purity can readily be produced at one step without producing any ionic by-products and therefore requiring a complicated refining step by reacting a bis-o-aminophenol compound with a dialdehyde compound, and they have come to complete the present invention.

Thus, the present invention provides a polybenzoxazole precursor having a repetitive unit represented by Formula (1):

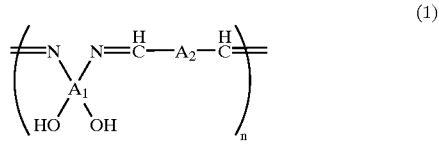

(1)

wherein $A_1$ represents a tetravalent aromatic group; N and OH which are bonded to $A_1$ are paired, and the respective pairs of N and OH are bonded to carbons which are adjacent to each other on the same aromatic ring; $A_2$ represents a divalent organic group; and n represents a number of 2 to 300.

Further, the present invention provides a production process for the polybenzoxazole precursor having the repetitive unit represented by Formula (1) described above, characterized by reacting a bis-o-aminophenol compound represented by Formula (2):

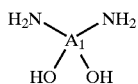

(2)

wherein $A_1$ represents a tetravalent aromatic group; an $NH_2$ group and an OH group which are bonded to $A_1$ are paired, and the respective pairs of an $NH_2$ group and an OH group are bonded to carbons which are adjacent to each other on the same aromatic ring with a dialdehyde compound represented by Formula (3):

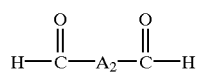

(3)

wherein $A_2$ represents a divalent organic group.

Further, the present invention provides a coating composition comprising the polybenzoxazole precursor described above.

Still further, the present invention provides a positive type light-sensitive resin composition comprising the polybenzoxazole precursor described above and a light-sensitive quinonediazide compound.

In the attached drawings.

Figure 1:
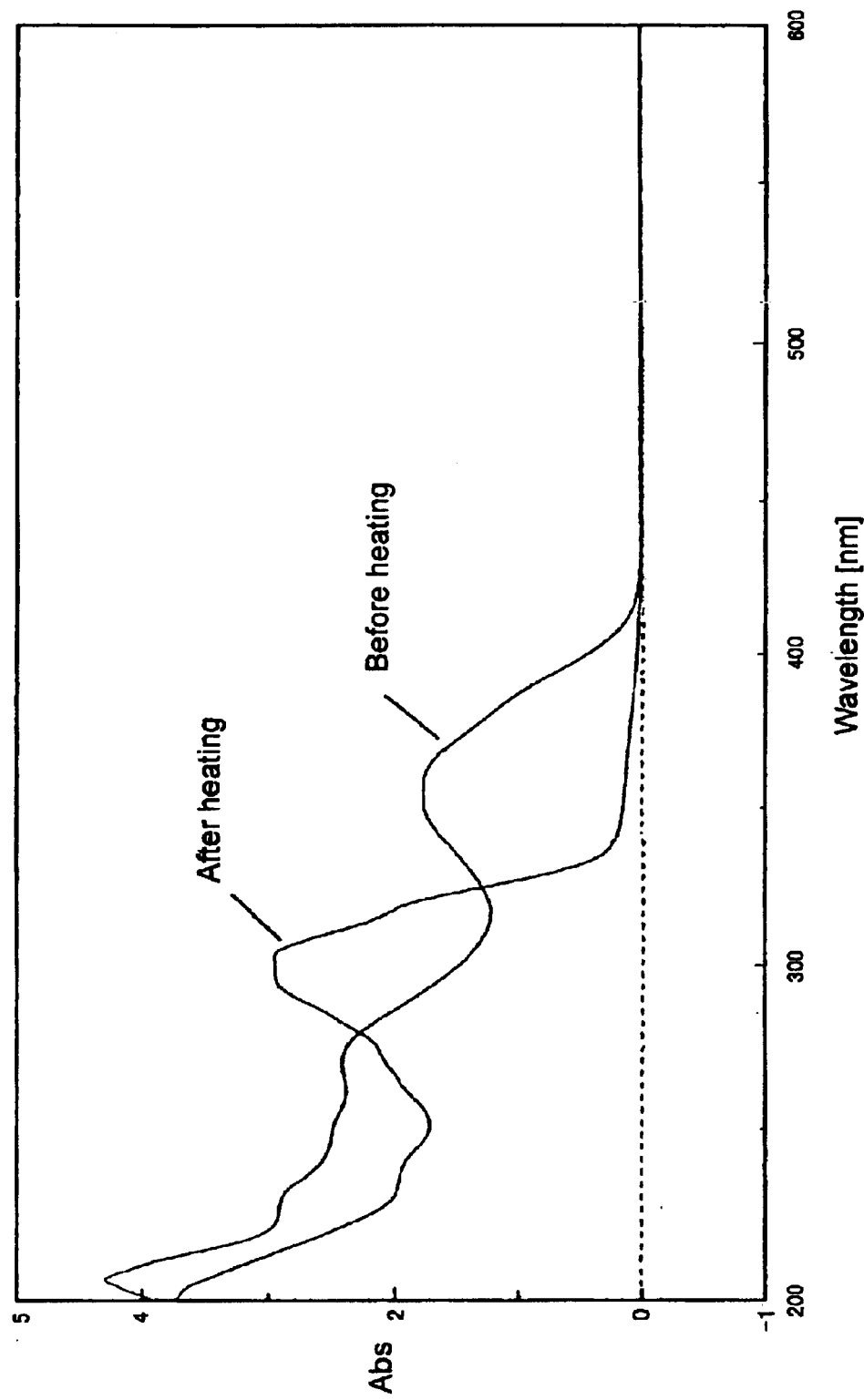
FIG. 1 shows an absorptiometric spectrum of a film before and after heating which is formed from the polyazomethine solution (A) obtained in Example 1.

The present invention shall be explained below in further details.

The polybenzoxazole precursor provided by the present invention can be produced by reacting a bis-o-aminophenol compound with a dialdehyde compound each described below.

Bis-o-aminophenol Compound

The bis-o-aminophenol compound used as a starting material in producing the polybenzoxazole precursor of the present invention is a compound represented by Formula (2):

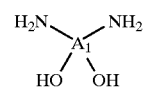

(2)

wherein $A_1$ represents a tetravalent aromatic group; an $NH_2$ group and an OH group which are bonded to $A_1$ are paired; and the respective pairs of an $NH_2$ group and an OH group are bonded to carbons which are adjacent to each other on the same aromatic ring.

Included in the aromatic group described above is a monocyclic or polycyclic aromatic group of a carbon ring type or a heterocyclic type containing at least one, preferably 1 to 3 hetero atoms selected from nitrogen, oxygen and sulfur atoms in the ring, in which a condensed ring may be formed if necessary. To be specific, those having, for example, the following structures can be given as such aromatic group $A_1$:

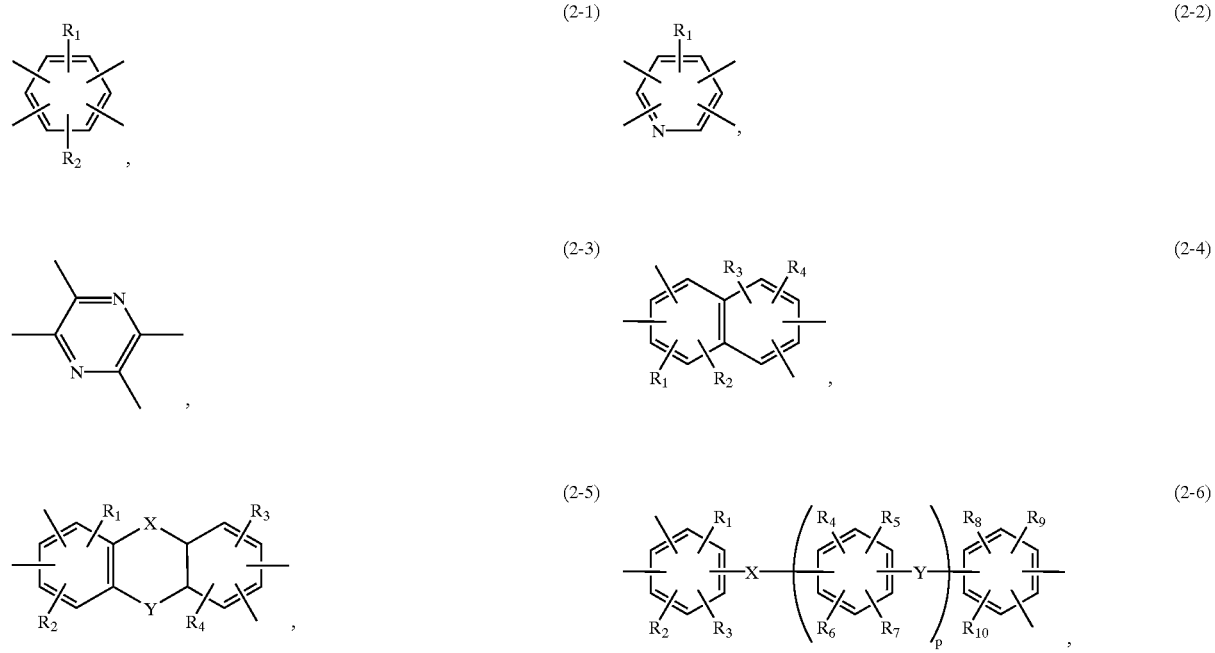

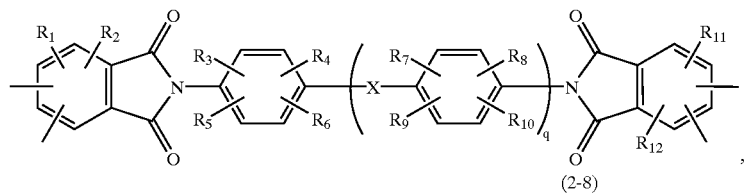

(2-7)

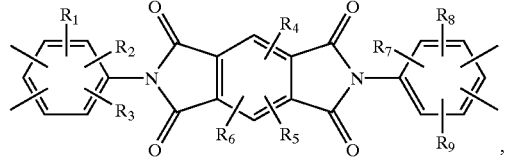

(2-8)

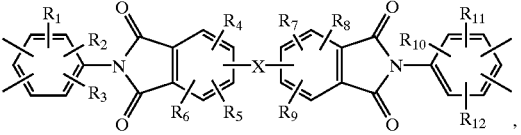

(2-9)

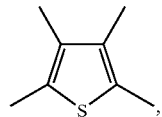, and (2-10) (2-11)

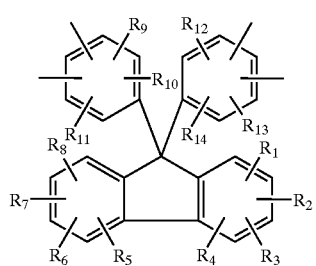

(2-12)

wherein X and Y each are selected independently from the group consisting of —$CH_2$—, —O—, —S—, —SO—, —$SO_2$—, —$SO_2NH$—, —CO—, —$CO_2$—, —NHCO—, —NHCONH—, —$C(CF_3)_2$—, —$CF_2$—, —$C(CH_3)_2$—, —$CH(CH_3)$—, —$C(CF_3)(CH_3)$—, —$Si(R_{21})_2$—, —O—Si$(R_{21})_2$—O—, —Si$(R_{21})_2$—O—Si$(R_{22})_2$—, —$(CH_2)_a$—Si$(R_{21})_2$—O—Si$(R_{22})_2$—$(CH_2)_a$— (wherein a is an integer of 0 to 6) and a direct bond; $R_1$ to $R_{14}$, $R_{21}$ and $R_{22}$ each represent independently H, F, an alkyl or alkoxyl group having 1 to 6 carbon atoms or —$(CF_2)_b$—$CF_3$ or —O—$(CF_2)_b$—$CF_3$ (wherein b is an integer of 0 to 5); and p and q each are an integer of 0 to 3.

Among these aromatic groups $A_1$, particularly preferred are the groups of the formulas (2-1) to (2-6) and (2-10) to (2-12), and further particularly preferred are the groups of the formulas (2-1), (2-4), (2-6) and (2-12).

The specific examples of the bis-o-aminophenol compound represented by Formula (2) described above include the following ones. They are merely examples, and the present invention shall not be restricted to them:

2,4-diamino-1,5-benzenediol, 2,5-diamino-1,4-benzenediol, 2,5-diamino-3-fluoro-1,4-benzenediol, 2,5-diamino-3,6-difluoro-1,4-benzenediol, 2,6-diamino-1,5-dihydroxynaphthalene, 1,5-diamino-2,6-dihydroxynaphthalene, 2,6-diamino-3,7-dihydroxynaphthalene, 1,6-diamino-2,5-dihydroxynaphthalene, 4,4'-diamino-3,3'-dihydroxybiphenyl, 3,3'-diamino-4,4'-dihydroxybiphenyl, 2,3'-diamino-3,2'-dihydroxybiphenyl, 3,4'-diamino-4,3'-dihydroxybiphenyl, 4,4'-diamino-3,3'-dihydroxy-6,6'-ditrifluoromethylbiphenyl, 3,3'-diamino-4,4'-dihydroxy-6,6'-ditrifluoromethylbiphenyl, 2,3'-diamino-3,2'-dihydroxy-6,6'-ditrifluoromethylbiphenyl, 3,4'-diamino-4,3'-dihydroxy-6,6'-ditrifluoromethylbiphenyl, 4,4'-diamino-3,3'-dihydroxy-5,5'-ditrifluoromethylbiphenyl, 3,3'-diamino-4,4'-dihydroxy-5,5'-ditrifluoromethylbiphenyl, 2,3'-diamino-3,2'-dihydroxy-5,5'-ditrifluoromethylbiphenyl, 3,4'-diamino-4,3'-dihydroxy-5,5'-ditrifluoromethylbiphenyl, bis(4-amino-3-hydroxyphenyl)methane, bis(3-amino-4-hydroxyphenyl)methane, 3,4'-amino-4,3'-dihydroxydiphenylmethane, bis(4-amino-3-hydroxy-6-trifluoromethylphenyl)methane, bis(3-amino-4-hydroxy-6-trifluoromethylphenyl)methane, 3,4'-diamino-4,3'-dihydroxy-6,6'-ditrifluoromethyldiphenylmethane, bis(4-amino-3-hydroxyphenyl)difluoromethane, bis(3-amino-4-hydroxyphenyl)difluoromethane, 3,4'-diamino-4,3'-dihydroxydiphenyldifluoromethane, bis(4-amino-3-hydroxy-6-trifluoromethylphenyl)difluoromethane, bis(3-amino-4-hydroxy-6-trifluoromethylphenyl)difluoromethane, 3,4'-diamino-4, 3'-dihydroxy-6,6'-ditrifluoromethyldiphenyldifluoromethane, bis(4-amino-3-hydroxyphenyl) ether, bis(3-amino-4-hydroxyphenyl) ether, 3,4'-diamino-4,3'-dihydroxydiphenyl ether, bis(4-amino-3-hydroxy-6-trifluoromethylphenyl) ether, bis(3-amino-4-hydroxy-6-trifluoromethylphenyl) ether, 3,4'-diamino-4,3'-dihydroxy-6,6'-ditrifluoromethyldiphenyl ether, bis(4-amino-3-hydroxyphenyl) ketone, bis(3-amino-4-hydroxyphenyl) ketone, 3,4'-diamino-4,3'-dihydroxydiphenyl ketone, bis(4-amino-3-hydroxy-6-trifluoromethylphenyl) ketone, bis(3-amino-4-hydroxy-6-trifluoromethylphenyl) ketone, 3,4'-diamino-4,3'-dihydroxy-6,6'-ditrifluoromethyldiphenyl ketone, 2,2-bis(3-amino-4-hydroxyphenyl)propane, 2,2-bis(4-amino-3-hydroxyphenyl)propane, 2,2-(3,4'-diamino-4,3'-dihydroxydiphenyl)propane, 2,2-bis(3-amino-4-hydroxy-6-trifluoromethylphenyl)propane, 2,2-bis(4-amino-3-hydroxy-6-trifluoromethylphenyl)propane, 2,2-(3,4'-diamino-4,3'-dihydroxy-6,6'-ditrifluoromethyldiphenyl)

propane, 2,2-bis(3-amino-4-hydroxyphenyl) hexafluoropropane, 2,2-bis(4-amino-3-hydroxyphenyl)hexafluoropropane, 2,2-(3,4'-diamino-4,3'-dihydroxydiphenyl)hexafluoropropane, 2,2-bis(3-amino-4-hydroxy-6-trifluoromethylphenyl)hexafluoropropane, 2,2-bis(4-amino-3-hydroxy-6-trifluoromethylphenyl)hexafluoropropane, 2,2-(3,4'-diamino-4,3'-dihydroxy-6,6'-ditrifluoromethyldiphenyl)hexafluoropropane, bis(4-amino-3-hydroxyphenyl)sulfone, bis(3-amino-4-hydroxyphenyl)sulfone, 3,4'-diamino-4,3'-dihydroxydiphenylsulfone, bis(4-amino-3-hydroxyphenyl)sulfide, 4-amino-3-hydroxyphenyl-4-amino-3-hydroxybenzoate, N-(4-amino-3-hydroxyphenyl)-4-amino-3-hydroxybenzanilide, bis(4-amino-3-hydroxyphenyl)dimethylsilane, bis(3-amino-4-hydroxyphenyl)dimethylsilane, 3,4'-diamino-4,3'-dihydroxydiphenyl ether, bis(4-amino-3-hydroxyphenyl)tetramethyldisiloxane, bis(3-amino-4-hydroxyphenyl)tetramethyldisiloxane, 2,4'-bis(4-amino-3-hydroxyphenoxy)biphenyl, 2,4'-bis(3-amino-4-hydroxyphenoxy)biphenyl, 4,4'-bis(3-amino-4-hydroxyphenoxy)biphenyl, 2,4'-bis(3-amino-4-hydroxyphenoxy)biphenyl, 2,4'-bis[4-(4-amino-3-hydroxyphenoxy)phenyl] ether, 2,4'-bis(3-amino-4-hydroxyphenoxy)biphenyl, 4,4'-bis[4-(4-amino-3-hydroxyphenoxy)phenyl] ether, 2,4'-bis[4-(3-amino-4-hydroxyphenoxy)phenyl] ether, 2,4'-bis[4-(3-amino-4-hydroxyphenoxy)phenyl] ether, 4,4'-bis(4-amino-3-hydroxyphenoxy)benzophenone, 4,4'-bis(3-amino-4-hydroxyphenoxy)benzophenone, 2,4'-bis(3-amino-4-hydroxyphenoxy)benzophenone, 2,2-bis(3-amino-4-hydroxy-5-trifluoromethylphenyl)propane, 2,4'-bis(4-amino-3-hydroxyphenoxy)octafluorobiphenyl, 2,4'-bis(3-amino-4-hydroxyphenoxy)octafluorobiphenyl, 4,4'-bis(3-amino-4-hydroxyphenoxy)octafluorobiphenyl, 2,4'-bis(3-amino-4-hydroxyphenoxy)octafluorobiphenyl, 4,4'-bis(4-amino-3-hydroxyphenoxy)octafluorobenzophenone, 4,4'-bis(4-amino-3-hydroxyphenoxy)octafluorobenzophenone, 4,4'-bis(3-amino-4-hydroxyphenoxy)octafluorobenzophenone, 2,4'-bis(3-amino-4-hydroxyphenoxy)octafluorobenzophenone, 2,2-bis(3-amino-4-hydroxy-5-trifluoromethylphenyl)hexafluoropropane, 2,2-bis[4-(4-amino-3-hydroxyphenoxy)phenyl]propane, 2,2-bis[4-(4-amino-3-hydroxyphenoxy)phenyl]hexafluoropropane, 2,2-bis[4-(3-amino-4-hydroxyphenoxy)phenyl]hexafluoropropane, 2,8-diamino-3,7-dihydroxydibenzofuran, 2,8-diamino-3,7-dihyroxydifluorene, 2,6-diamino-3,7-dihydroxyxanthene, 9,9-bis(4-amino-3-hydroxyphenyl)fluorene, 9,9-bis(3-amino-4-hydroxyphenyl)fluorene, and compounds represented by the following formulas:

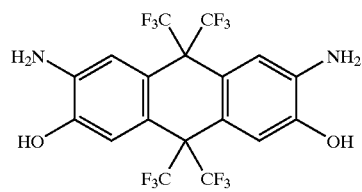

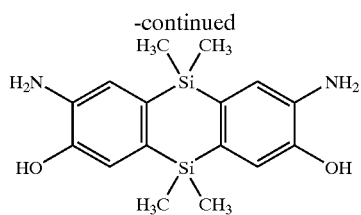

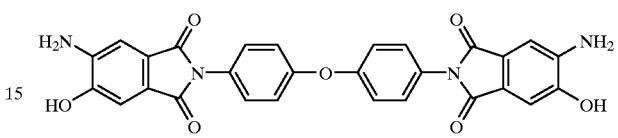

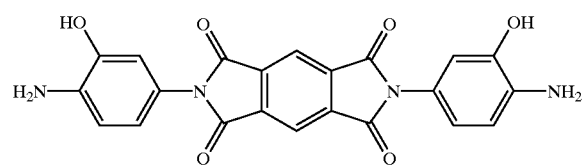

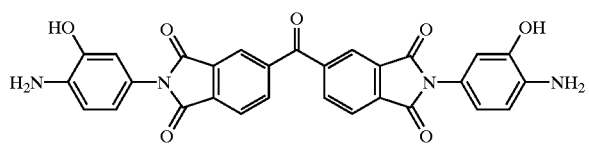

These compounds each can be used alone or may be used in combination of two or more kinds thereof.

Dialdehyde Compound

The dialdehyde compound which is reacted with the bis-o-aminophenol compound represented by Formula (2) described above according to the method of the present invention is represented by Formula (3):

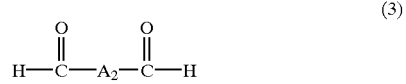

(3)

wherein $A_2$ represents a divalent organic group.

Included in the divalent organic group, described above is a saturated or unsaturated, monocyclic or polycyclic divalent group of a carbon ring type or a heterocyclic type containing at least one, preferably 1 to 3 hetero atoms selected from nitrogen, oxygen and sulfur in the ring, in which a condensed ring may be formed if necessary. To be specific, those having, for example, the following structures can be given as such organic group:

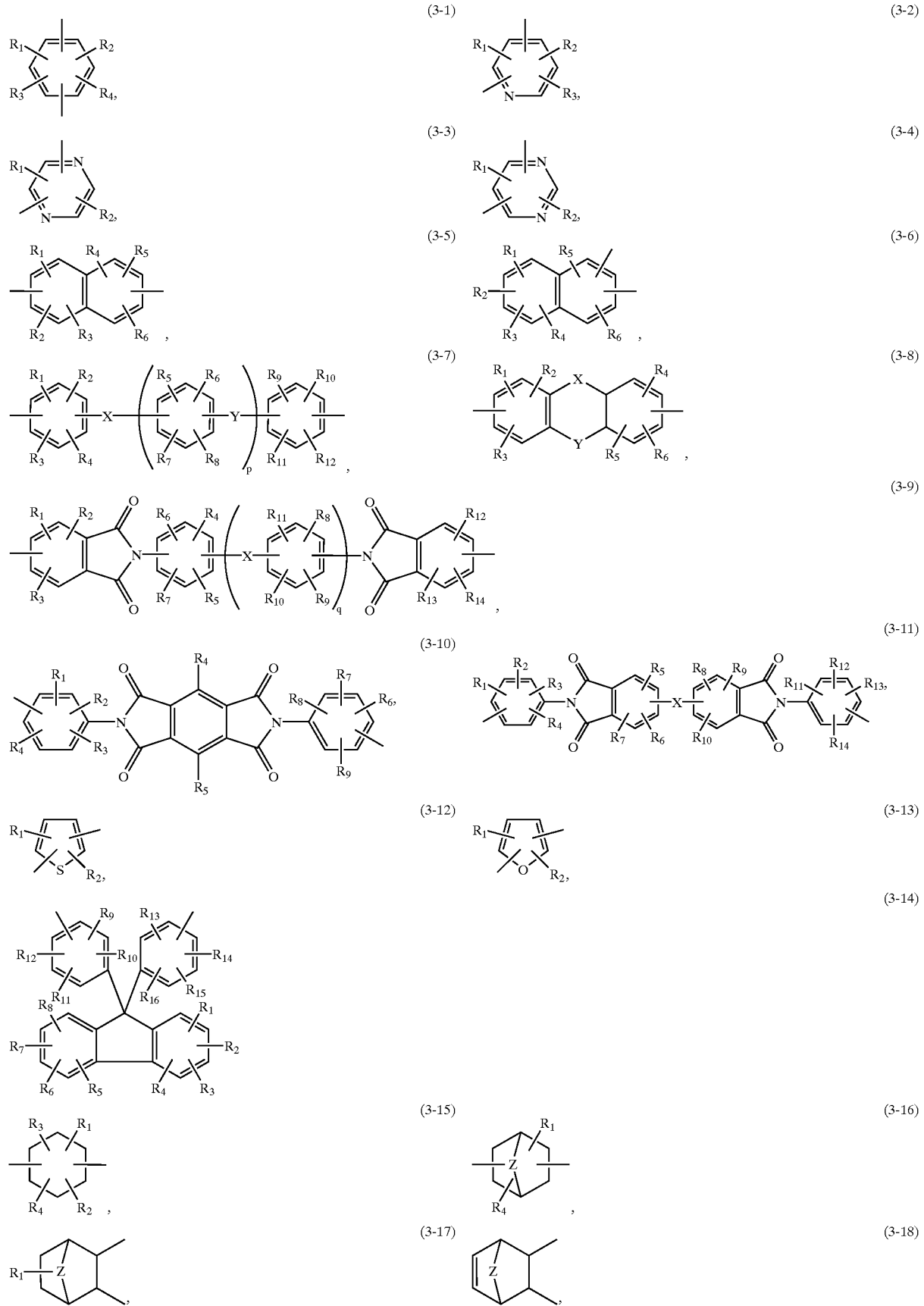

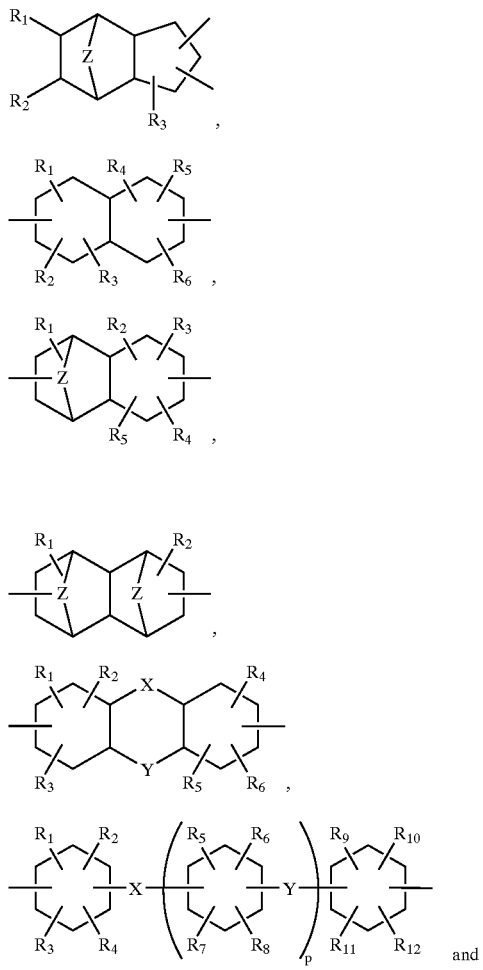

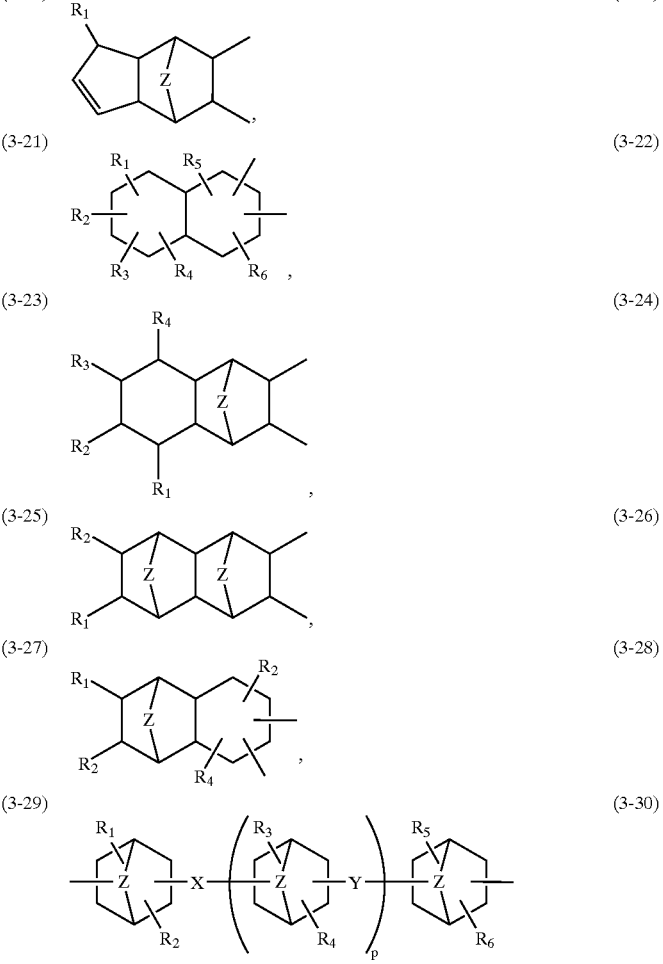

wherein X and Y each are selected independently from the group consisting of —$CH_2$—, —O—, —S—, —SO—, —$SO_2$—, —$SO_2NH$—, —CO—, —$CO_2$—, —NHCO—, —NHCONH—, —$C(CF_3)_2$—, —$CF_2$—, —$C(CH_3)_2$—, —$CH(CH_3)$—, —$C(CF_3)(CH_3)$—, —$Si(R_{21})_2$—, —O—$Si(R_{21})_2$—O—, —$Si(R_{21})_2$—O—$Si(R_{22})_2$—, —$(CH_2)_a$—$Si(R_{21})_2$—O—$Si(R_{22})_2$—$(CH_2)_a$— (wherein a is an integer of 0 to 6) and a direct bond; $R_1$ to $R_{16}$, $R_{21}$ and $R_{22}$ each represent independently H, F, an alkyl or alkoxyl group having 1 to 6 carbon atoms or —$(CF_2)_b$—$CF_3$ or —O—$(CF_2)_b$—$CF_3$ (wherein b is an integer of 0 to 5); Z represents —$CH_2$—, —$C_2H_4$— or —$CH_2$=$CH_2$—; and p and q each are an integer of 0 to 3.

Among these organic groups $A_2$, particularly preferred are the groups of the formulas (3-1) to (3-8), (3-12) to (3-22), and (3-25), (3-27) to (3-29), and further particularly preferred are the groups of the formulas (3-1), (3-5), (3-7), and (3-14).

The specific examples of the dialdehyde compound represented by Formula (3) described above include the following ones. They are merely examples, and the present invention shall not be restricted to them:
aromatic dialdehydes such as phthalaldehyde, isophthalaldehyde, terephthalaldehyde, 3-fluorophthalaldehyde, 4-fluorophthalaldehyde, 2-fluoroisophthalaldehyde, 4-fluoroisophthalaldehyde, 5-fluoroisophthalaldehyde, 2-fluoroterephthalaldehyde, 3-trifluoromethylphthalaldehyde, 4-trifluoromethylphthalaldehyde, 2-trifluoromethylisophthalaldehyde, 4-trifluoromethylisophthalaldehyde, 5-trifluoromethylisophthalaldehyde, 2-trifluoromethylterephthalaldehyde, 3,4,5,6-tetrafluorophthalaldehyde, 2,4,5,6-tetrafluoroisophthalaldehyde, 2,3,5,6-tetrafluoroterephthalaldehyde, pyridine-2,3-dialdehyde, pyridine-3,4-dialdehyde, pyridine-3,5-dialdehyde, pyrazine-2,3-dialdehyde, pyrazine-2,5-dialdehyde, pyrazine-2,6-dialdehyde, pyrimidine-2,4-dialdehyde, pyrazine-4,5-dialdehyde, pyrazine-4,6-dialdehyde, naphthalene-1,5-dialdehyde, naphthalene-1,6-dialdehyde, naphthalene-2,6-dialdehyde, naphthalene-3,7-dialdehyde, 2,3,4,6,7,8-hexafluoronaphthalene-1,5-dialdehyde, 2,3,4,5,6,8-hexafluoronaphthalene-1,6-dialdehyde, 1,3,4,5,7,8-hexafluoronaphthalene-2,6-dialdehyde, 1-trifluoromethylnaphthalene-2,6-dialdehyde, 1,5-bis(trifluoromethyl)naphthalene-2,6-dialdehyde, 1-trifluoromethylnaphthalene-3,7-dialdehyde, 1,5-bis(trifluoromethyl)naphthalene-3,7-dialdehyde, 1-trifluoromethyl-2,4,5,6,8-pentafluoronaphthalene-3,7-dialdehyde, 1-bis(trifluoromethyl)methoxy-2,4,5,6,8-pentafluoronaphthalene-3,7-dialdehyde, 1,5-bis(trifluoromethyl)-2,4,6,8-tetrafluoronaphthalene-3,7- dialehyde, 1,5-bis[bis(trifluoromethyl)methoxy]-2,4,6,
8-tetrafluoronaphthalene-3,7-dialdehyde, 2,
2'-biphenyldialdehyde, 2,4'-biphenyldialdehyde, 3,3'-biphenyldialdehyde, 6,6'-difluoro-3,4'-biphenyldialdehyde, 4,4'-biphenyldialdehyde, 6,6'-difluoro-2,4'-biphenyldialdehyde, 6,6'-difluoro-3,3'-biphenyldialdehyde, 6,6'-difluoro-3,4'-biphenyldialdehyde, 6,6'-difluoro-4,4'-biphenyldialdehyde, 6,6'-ditrifluoromethyl-2,2'-biphenyldialdehyde, 6,6'-ditrifluoromethyl-2,4'-biphenyldialdehyde, 6,6'-ditrifluoromethyl-3,3'-biphenyldialdehyde, 6,6'-ditrifluoromethyl-3,4'-biphenyldialdehyde, 6,6'-ditrifluoromethyl-4,4'-biphenyldialdehyde, 2.4°-oxydibenzaldehyde, 3,3'-oxydibenzaldehyde, 3,4'-oxydibenzaldehyde, 4,4'-oxydibenzaldehyde, 2,4'-diformyldiphenylmethane, 3,3'-diformyldiphenylmethane, 3,4'-diformyldiphenylmethane, 4,4'-diformyldiphenylmethane, 2,4'-diformyldiphenyldifluoromethane, 3,3'-diformyldiphenyldifluoromethane, 3,4'-diformyldiphenyldifluoromethane, 4,4'-diformyldiphenyldifluoromethane, 3,3'-diformyldiphenylsulfone, 3,4'-diformyldiphenylsulfone, 4,4'-diformyldiphenylsulfone, 3,3'-diformyldiphenylsulfide, 3,4'-diformyldiphenylsulfide, 4,4'-diformyldiphenylsulfide, 3,3'-diformyldiphenyl ketone, 3,4'-diformyldiphenyl ketone, 4,4'-diformyldiphenyl ketone, 2,2-bis(3-formylphenyl)propane, 2,2-bis(4-formylphenyl)propane, 2,2-(3,4'-diformylphenyl)propane, 2,2-(3,4'-diformylphenyl)propane, 2,2-(2,4'-diformylphenyl)propane, 2,2-bis(3-formylphenyl)hexafluoropropane, 2,2-bis(4-formylphenyl)hexafluoropropane, 2,2-(2,4'-diformylphenyl)hexafluoropropane, 2,2-(3,4'-diformylphenyl)hexafluoropropane, 1,3-bis(3-formylphenoxy)benzene, 1,4-bis(3-formylphenoxy)benzene, 1,4-bis(4-formylphenoxy)benzene, 3,3'-[1,4-phenylenebis(1-methylethylidene)]bisbenzaldehyde, 3,4'-[1,4-phenylenebis(1-methylethylidene)]bisbenzaldehyde, 4,4'-[1,4-phenylenebis(1-methylethylidene)]bisbenzaldehyde, 2,2-bis[4-(2-formylphenoxy)phenyl]propane, 2,2-bis[4-(3-formylphenoxy)phenyl]propane, 2,2-bis[4-(4-formylphenoxy)phenyl]propane, 2,2-bis [4-(3-formylphenoxy)phenyl]hexafluoropropane, 2,2-bis[4-(4-formylphenoxy)phenyl]hexafluoropropane, bis(4-(3-formylphenoxy)phenyl)sulfide, bis(4-(4-formylphenoxy)phenyl)sulfide, bis(4-(3-formylphenoxy)phenyl)sulfone, bis(4-(4-formylphenoxy)phenyl)sulfone, fluorene-2,6-diformylanthraquinone, fluorene-2,7-dialdehyde, 3,7-dibenzofurandialdehyde, 9,9-bis[4-formylphenyl]fluorene, 9,9-bis[3-formylphenyl]fluorene and 9,9-bis[3,4'-formylphenyl]fluorene; and alicyclic dialdehydes such as 1,4-cyclohexanedialdehyde, 1,3-cyclohexanedialdehyde, bicyclo[2.2.1]heptane-2,5-dialdehyde, bicyclo[2.2.2]octane-2,5-dialdehyde, bicyclo[2.2.2]octa-7-ene-2,5-dialdehyde, bicyclo[2.2.1]heptane-2,3-dialdehyde, bicyclo[2.2.1]hepta-5-ene-2,3-dialdehyde, tricyclo[5.2.1.0$^{2,6}$]decane-3,4-dialdehyde, tricyclo[5.2.1.0$^{2,6}$]deca-4-ene-8,9-dialdehyde, perhydronaphthalene-2,3-dialdehyde, perhydronaphthalene-1,4-dialdehyde, perhydronaphthalene-1,6-dialdehyde, perhydro-1,4-dimethanonaphthalene-2,3-dialdehyde, perhydro-1,4-dimethanonaphthalene-2,7-dialdehyde, perhydro-1,4-dimethanonaphthalene-7,8-dialdehyde, perhydro-1,4:5,8-dimethanonaphthalene-2,3-dialdehyde, perhydro-1,4:5,8-dimethanonaphthalene-2,7-dialdehyde, perhydro-1,4:5,8:9,10-trimethanoanthracene-2,3-dialdehyde, 4,4'-diformylbicyclohexyl, 3,4'-oxydicyclohexanecarbaldehyde, 3,3'-diformyldicyclohexylmethane, 3,4'-diformyldicyclohexylmethane, 4,4'-diformyldicyclohexylmethane, 3,3'-diformyldicyclohexyldifluoromethane, 3,4'-diformyldicyclohexyldifluoromethane, 4,4'-diformyldicyclohexylfluoromethane, 3,3'-diformyldicyclohexylsulfone, 3,4'-diformyldicyclohexylsulfone, 4,4'-diformyldicyclohexylsulfone, 3,3'-diformyldicyclohexylsulfide, 3,4'-diformyldicyclohexylsulfide, 4,4'-diformyldicyclohexylsulfide, 3,3'-diformyldicyclohexyl ketone, 3,4'-diformyldicyclohexyl ketone, 4,4'-diformyldicyclohexyl ketone, 2,2-bis(3-formylcyclohexyl)propane, 2,2-bis(4-formylcyclohexyl)propane, 2,2-bis(3-formylcyclohexyl)hexafluoropropane, 2,2-bis(4-formylcyclohexyl)hexafluoropropane, 1,3-bis(3-diformylcyclohexyl)benzene, 1,4-bis(3-formylcyclohexyl)benzene, 1,4-bis(4-formylcyclohexyl)benzene, 3,3'-(1,4-cyclohexylenebis(1-methylethylidene))biscyclohexanecarbaldehyde, 3,4'-(1,4-cyclohexylenebis(1-methylethylidene))biscyclohexanecarbaldehyde, 4,4'-(1,4-cyclohexylenebis(1-methylethylidene))biscyclohexanecarbaldehyde, 2,2-bis(4-(3-formylcyclohexyl)cyclohexyl)propane, 2,2-bis(4-(4-formylcyclohexyl)cyclohexyl)propane, 2,2-bis(4-(3-formylcyclohexyl)cyclohexyl)hexafluoropropane, 2,2-bis(4-(4-formylcyclohexyl)cyclohexyl)hexafluoropropane, bis(4-(3-formylcyclohexyloxy)cyclohexyl)sulfide, bis(4-(4-formylcyclohexyloxy)cyclohexyl)sulfide, bis(4-(3-cyclohexyloxy)cyclohexyl)sulfone, bis(4-(4-formylcyclohexyloxy)cyclohexyl)sulfone, 2,2'-bicyclo[2.2.1]heptane-5,6'-dialdehyde and 2,2'-bicyclo[2.2.1]heptane-6,6'-dialdehyde; and compounds represented by the following formulas:

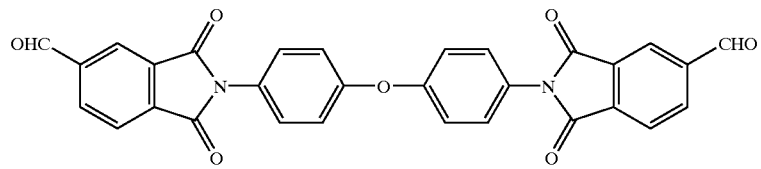

-continued

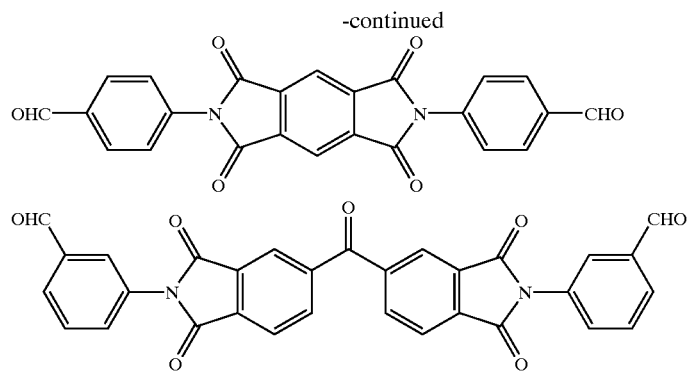

These compounds each can be used alone or may be used in combination of two or more kinds thereof.

Production of Polybenzoxazole Precursor

The bis-o-aminophenol compound represented by Formula (2) is reacted with the dialdehyde compound represented by Formula (3), whereby the polybenzoxazole precursor of the present invention having the repetitive unit represented by Formula (1) described below is produced:

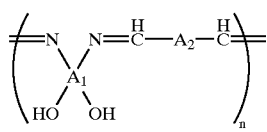

(1)

wherein $A_1$ and $A_2$ are synonymous with those defined previously, and n is a number of 2 to 300, particularly 3 to 300 and further particularly 10 to 200.

The reaction of the bis-o-aminophenol compound represented by Formula (2) with the dialdehyde compound represented by Formula (3) is a formation reaction of a Schiff base and can be carried out by a conventionally known method. It can be carried out by reacting the bis-o-aminophenol compound represented by Formula (2) with the dialdehyde compound represented by Formula (3) at a temperature of a room temperature to about 200° C., preferably a room temperature to about 160° C. for 2 to 72 hours in an inert solvent including amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, or monoethers or diethers of those glycols with methanol, ethanol, butanol, hexanol, octanol, benzyl alcohol, phenol and cresol, or glycol ethers such as esters of the above monoethers; cyclic ethers such as dioxane and tetrahydrofuran; cyclic carbonates such as ethylene carbonate and propylene carbonate; aliphatic and aromatic hydrocarbons; and dimethylsulfoxide.

In this case, the dialdehyde compound represented by Formula (3) can be used usually in a range of 0.5 to 1.5 mole, preferably 0.8 to 1.2 mole per mole of the bis-o-aminophenol compound represented by Formula (2).

Thus, the polybenzoxazole precursor having the repetitive unit represented by Formula (1) described above is obtained in the form of a solution prepared by dissolving it in the solvent described above.

The polybenzoxazole precursor thus obtained can have an intrinsic viscosity falling in a range of usually 0.1 to 1.5 dl/g, preferably 0.2 to 0.8 dl/g depending on the number (n) of the repetitive unit represented by Formula (1) described above. In the present specification, the intrinsic viscosity is a value measured at 30° C. by means of an Ostwald viscometer.

Coating Composition

The polybenzoxazole precursor of the present invention is subjected to ring closure by heating, whereby formed is a polybenzoxazole resin having a repetitive unit represented by Formula (4), which is excellent in an electric insulating property, a heat resistance and a mechanical strength:

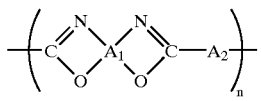

(4)

wherein $A_1$, $A_2$ and n are synonymous with those described above.

The polybenzoxazole precursor of the present invention is blended, if necessary, with a solvent and/or various additives, for example, a surfactant and a coupling agent, whereby capable of being prepared is a coating composition useful for forming films such as an interlayer insulating film for a semiconductor, a protective film, an interlayer insulating film for a multilayer circuit, a cover coat for a flexible copper-clad board, a solder resist film and a liquid crystal-aligned film.

The solvent described above shall not specifically be restricted as long as it dissolves the polybenzoxazole precursor of the present invention and the additives used if necessary, and capable of being given are, for example, amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, or monoethers or diethers of those glycols with methanol, ethanol, butanol, hexanol, octanol, benzyl alcohol, phenol and cresol, or glycol ethers such as esters of the above monoethers; cyclic ethers such as dioxane and tetrahydrofuran; cyclic carbonates such as ethylene carbonate and propylene carbonate; aliphatic and aromatic hydrocarbons; and dimethylsulfoxide. These solvents can be used, if necessary, alone or in a mixture of two or more kinds thereof.

A content of the polybenzoxazole precursor of the present invention in the coating composition described above shall not specifically be restricted and can be changed according to the uses thereof. In general, it falls suitably in a range of 5 to 60% by weight, particularly 10 to 40% by weight in terms of a concentration of the resin solid matter.

A base material to which the coating composition of the present invention can be applied shall not specifically be restricted and includes, for example, silicone wafers, semiconductor materials such as gallium arsenites, metals, metal oxides, ceramics, resins, substrates for a printed circuit on which a copper foil is laminated and glass. The above coating composition can be applied on these base materials by, for example, conventionally known coating methods such as spin coating, spray coating, roll coating, curtain flow coating and a printing method.

The coating film thus formed is then dried and baked. A thickness of the coating film shall not strictly be restricted and can be changed according to the use purposes thereof, and it can fall usually in a range of about 0.1 to about 100 $\mu$m, preferably about 0.5 to about 30 $\mu$m in terms of a dried film thickness. The polybenzoxazole precursor coating film thus formed is pre-baked, if necessary, at a temperature of 80 to 190° C. for about 10 seconds to about 120 minutes and then baked at a temperature of 200 to 500° C., preferably 250 to 400° C. for about 10 to about 300 minutes, whereby it can be turned into a polybenzoxazole resin film.

Positive Type Light-Sensitive Resin Composition

The polybenzoxazole precursor of the present invention can be turned into a positive type light-sensitive resin composition by combining with a light-sensitive quinonediazide compound and can be used, for example, for forming patterns.

The light-sensitive quinonediazide compound which can be used in combination with the polybenzoxazole precursor of the present invention is a light-sensitive compound having at least one quinonediazide unit in a molecule and includes, for example, 1,2-benzoquinonediazide-4-sulfonic acid esters, 1,2-naphthoquinonediazide-4-sulfonic acid esters and 1,2-naphthoquinonediazide-5-sulfonic acid esters.

These quinonediazide sulfonic acid esters can be obtained by conventionally known methods, for example, by subjecting a compound having a polyhydric phenolic hydroxyl group such as polyhydroxybenzophenone including tri- or tetrahydroxybenzophenone to condensation reaction with quinonediazisulfonic halide such as benzoquinonediazide sulfonic chloride and naphthoquinonediazide sulfonic chloride in the presence of a weak alkali (refer to Japanese Patent Application Laid-Open No. 53314/1993).

Further, the above quinonediazide sulfonic acid esters can be produced as well, for example, by reacting a hydroxyl group-containing quinonediazide compound obtained by reacting quinonediazide sulfonic chloride with hydroxylamine, with compounds having at least one carboxylic halide group in a molecule (for example, halides such as chloride and iodide of aromatic or alicyclic carboxylic acids such as isophthalic acid, terephthalic acid, naphthalenedicarboxylic acid or hydrogenated products thereof; and the same halides of aliphatic carboxylic acids such as adipic acid, azelaic acid and sebacic acid) in such a proportion that a hydroxyl group and a carboxylic halide group stay in an equimolar ratio or in such a proportion that a mole number of a carboxylic halide group to a mole number of a hydroxyl group falls excessive. In this case, a carboxylic halide group is used in an excess amount in terms of a mole number to turn a carboxylic halide group contained in the product into a carboxyl group, whereby a light-sensitive quinonediazide compound having a carboxyl group can be produced (Japanese Patent Application Laid-Open No. 287222/1993 (=U.S. Pat. No. 5,439,774)).

Further, a polymer having a quinonediazide unit can be used as the light-sensitive quinonediazide compound, and such polymer can be produced by methods such as, for example, reacting a hydroxyl group-containing quinonediazide compound obtained by reacting quinonediazide sulfonic chloride with hydroxylamine with an isocyanate group of a polymer having an isocyanate group to introduce a quinonediazide unit into the polymer; reacting a polymer having a hydroxyl group with a hydroxyl group-containing quinonediazide compound via a diisocyanate compound to introduce a quinonediazide unit into the polymer; copolymerizing a monomer obtained by reacting a hydroxyl group of the above quinonediazide compound with a monomer having an isocyanate group with the other monomers; and copolymerizing a monomer obtained by reacting a hydroxyl group of the above quinonediazide compound with a hydroxyl group of a monomer having a hydroxyl group via a diisocyanate compound with the other monomers. In this case, a polymer having a carboxyl group is further used as the polymer into which a hydroxyl group-containing quinonediazide group is to be introduced, or a monomer having a carboxyl group is used as at least a part of the other monomers copolymerized with a monomer into which a hydroxyl group-containing quinonediazide group is introduced, whereby a light-sensitive quinonediazide compound having a carboxyl group can be obtained (refer to Japanese Patent Application Laid-Open No. 90270/1989 (=U.S. Pat. No. 4,975,351)).

Further, the quinonediazide polymer can be produced, for example, by reacting the hydroxyl group of the hydroxyl group-containing quinonediazide compound described above with the carboxylic halide group of a polymer having a carboxylic halide group such as carboxylic chloride (for example, copolymers of halides of polymerizable carboxylic acids such as (meth)acrylic chloride and crotonic chloride with polymerizable unsaturated monomers not having a reactivity with acid halides, and resins obtained by converting the carboxyl groups of acryl resins and polyester resins each having carboxyl groups into halides by thionyl chloride) in an equimolar ratio or in an excess ratio of a mole number of a carboxylic halide group to a mole number of a hydroxyl group. When a mole number of a carboxylic halide group is excessive, the carboxylic halide group is converted into a carboxylic group, whereby a light-sensitive quinonediazide compound having a carboxyl group can be produced (Japanese Patent Application Laid-Open No. 287222/1993 (=U.S. Pat. No. 5,439,774)).

Further, a light-sensitive quinonediazide compound can be produced as well, for example, by reacting the hydroxyl group-containing quinonediazide compound described above with a polymerizable unsaturated monomer having a carboxylic halide group such as (meth)acrylic chloride and copolymerizing the resulting unsaturated group-containing quinonediazide compound with the other unsaturated group-containing monomers. In this case, an unsaturated monomer having a carboxyl group is used as at least a part of the other monomers copolymerized, whereby a light-sensitive resin having a carboxyl group can be obtained (refer to Japanese Patent Application Laid-Open No. 53877/1992 (=DE-A-4120417)).

The positive type light-sensitive resin composition provided by the present invention can further be blended, if necessary, with additives such as a surfactant, a fluidity-controlling agent and a chelating agent and a colorant such as a pigment and a dye in addition to the polybenzoxazole precursor of the present invention and the light-sensitive quinonediazide compound described above.

The above positive type light-sensitive resin composition can be prepared by mixing the respective components described above as they are or, if necessary, in a solvent. The solvent which can be used in this case shall not specifically be restricted as long as it can dissolve the respective components contained in the composition, and capable of being given are, for example, amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, or monoethers or diethers of those glycols with methanol, ethanol, butanol, hexanol, octanol, benzyl alcohol, phenol and cresol, or glycol ethers such as esters of the above monoethers; cyclic ethers such as dioxane and tetrahydrofuran; cyclic carbonates such as ethylene carbonate and propylene carbonate; aliphatic and aromatic hydrocarbons; and dimethylsulfoxide. These solvents can be used, if necessary, alone or in a mixture of two or more kinds thereof.

A blending proportion of the polybenzoxazole precursor (A) of the present invention to the light-sensitive quinonediazide compound (B) in the positive type light-sensitive resin composition described above shall not strictly be restricted and can be changed according to the use purposes of the above composition, and it can fall in a range of usually 95/5 to 50/50, particularly 90/10 to 60/40 in terms of a solid matter weight ratio of (A)/(B).

Formation of Patterns

Patterns can be formed using the light-sensitive resin composition described above, for example, in a manner described below.

First, the light-sensitive resin composition is applied on a substrate such as a silicone wafer of a semiconductor material, ceramics, gallium arsenites, an aluminum plate for PS print, a substrate for a printed circuit on which a copper foil is laminated, metal oxides, a glass plate and a resin by a conventionally known method such as spin coating, spray coating, roll coating, curtain flow coating and a printing method and dried. A coating film thickness thereof shall not strictly be restricted and can be changed according to the use purposes of the patterns formed, and it falls suitably in a range of usually about 0.1 to about 50 micron, particularly about 1 to about 30 micron in terms of a dried film thickness.

Next, the coated resist film is irradiated with active light such as UV ray via a pattern mask (for example, a photographic positive) and exposed. In general, light having a wavelength of 3,000 to 4,500 angstrom is suited to the active light used for exposure. A light source emitting such light includes, for example, sunlight, a mercury-arc lamp, a xenon lamp and an arc lamp. An irradiation amount of the active light can fall in a range of usually 30 to 800 $mJ/cm^2$, preferably 50 to 500 $mJ/cm^2$. The coating film after exposure may be heated, if necessary, at a temperature of 50 to 140° C.

After irradiated with the active light and exposed, the coating film is developed. The developing treatment is carried out usually by washing away an exposed part of the coating film by an alkaline aqueous solution. The examples of the alkaline aqueous solution which can be used for this developing treatment include alkaline aqueous solutions of caustic soda, caustic potash, sodium metasilicate and sodium carbonate; tetraalkylammonium salt aqueous solutions of tetramethylammonium hydroxide; and amine compound aqueous solutions of triethylamine, diethanolamine and dimethylethanolamine.

Further, if a substrate can be etched, an exposed substrate part is removed by a suitable etchant, whereby a pattern film can be obtained.

The resulting pattern film of the polybenzoxazole precursor is baked usually at a temperature of 200 to 500° C., preferably 250 to 400° C. for about 10 to about 300 minutes, whereby the pattern film of the polybenzoxazole precursor can be prepared.

The present invention shall more specifically be explained below with reference to examples and comparative examples. "Percentage" is based on weight in all cases.

Synthesis of Polybenzoxazole Precursor

EXAMPLE 1

An Erlenmeyer flask into which a rotator was put was charged with 0.732 g (2 mmol) of 2,2'-bis(3-amino-4-hydroxyphenyl)hexafluoropropane and one ml of N-methyl-2-pyrrolidone and stirred for 5 minutes. Then, 0.268 g (2 mmol) of isophthalaldedhyde was added thereto, and the solution was stirred for 3 hours to obtain a 40% polyazomethine solution (A) which was a polybenzoxazole precursor. The solution thus obtained had an intrinsic viscosity of 0.1 dl/g. The resulting polybenzoxazole precursor had a number average molecular weight of about 1500.

EXAMPLE 2

The same operation as in Example 1 was carried out to obtain a polyazomethine solution (B) which was a polybenzoxazole precursor, except that in Example 1, 0.432 g (2 mmol) of 4,4'-diamino-3,3'-dihydroxybiphenyl was substituted for 2,2'-bis(3-amino-4-hydroxyphenyl)hexafluoropropane. The polybenzoxazole precursor thus obtained had a number average molecular weight of about 1000.

Comparative Example 1

An eggplant type equipped with a three-way cock was charged with a rotator and 0.732 g (2 mmol) of 2,2'-bis(3-amino-4-hydroxyphenyl)hexafluoropropane and substituted with nitrogen. One ml of N-methyl-2-pyrrolidone dissolving 0.316 g (4 mmol) of pyridine was added and stirred for 30 minutes while cooling at 0° C. on an ice and water bath. Then, one ml of N-methyl-2-pyrrolidone dissolving 0.406 g (2 mmol) of isophthalic dichloride was slowly dropped thereto, and then the solution was raised to a room temperature and stirred for 10 hours. The reaction solution was poured into a large amount of methanol to precipitate a polymer. The polymer precipitated was filtered off and washed with methanol, and then it was dried under vacuum to obtain polyhydroxyamide (C).

EXAMPLE 3

The polyazomethine solution (A) obtained in Example 1 was applied on a quartz plate by means of a spin coater to prepare a thin film of 0.3 micron, and the film was pre-baked at 100° C. for 30 seconds. The resulting film was subjected to absorptiometric analysis at a wavelength extending from 200 nm to 700 nm. Then, a film obtained by heating at 300° C. for one hour was subjected to absorptiometric analysis and compared with the result of the film before heating. The results thereof are shown in FIG. 1. Absorption in the vicinity of 340 to 400 nm was decreased, and absorption in the vicinity of 300 nm was increased.

Figure 2:
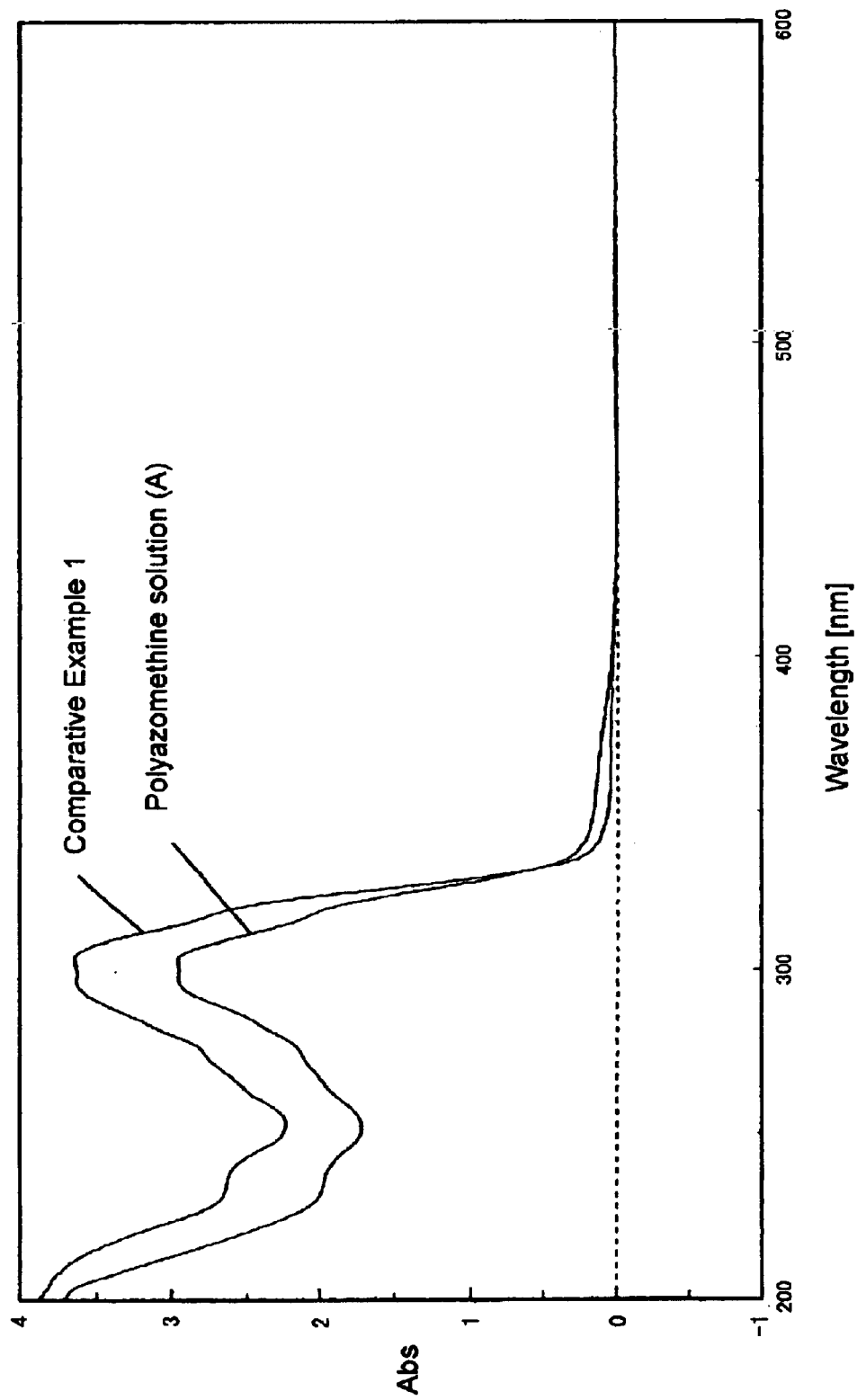
FIG. 2 shows the absorptiometric spectra of films after heating which are formed from the polyazomethine solution (A) obtained in Example 1 and the polyhydroxyamide solution (C) obtained in Comparative Example 1.

Next, an N-methyl-2-pyrrolidone solution (solid content: 10%) dissolving the polyhydroxyamide (C) synthesized in Comparative Example 1 was applied on a quartz plate by means of a spin coater to prepare a thin film of 0.3 micron, and the film was pre-baked at 100° C. for 30 seconds. Then, the film was heated at 300° C. for one hour to obtain a polybenzoxazole film, and the resulting film was then subjected to absorptiometric analysis at a wavelength extending from 200 nm to 700 nm to find that an analytical spectrum thereof (FIG. 2) agreed with the analytical spectrum of the film obtained by applying the polyazomethine solution (A) described above and heating at 300° C. for one hour.

Figure 3:
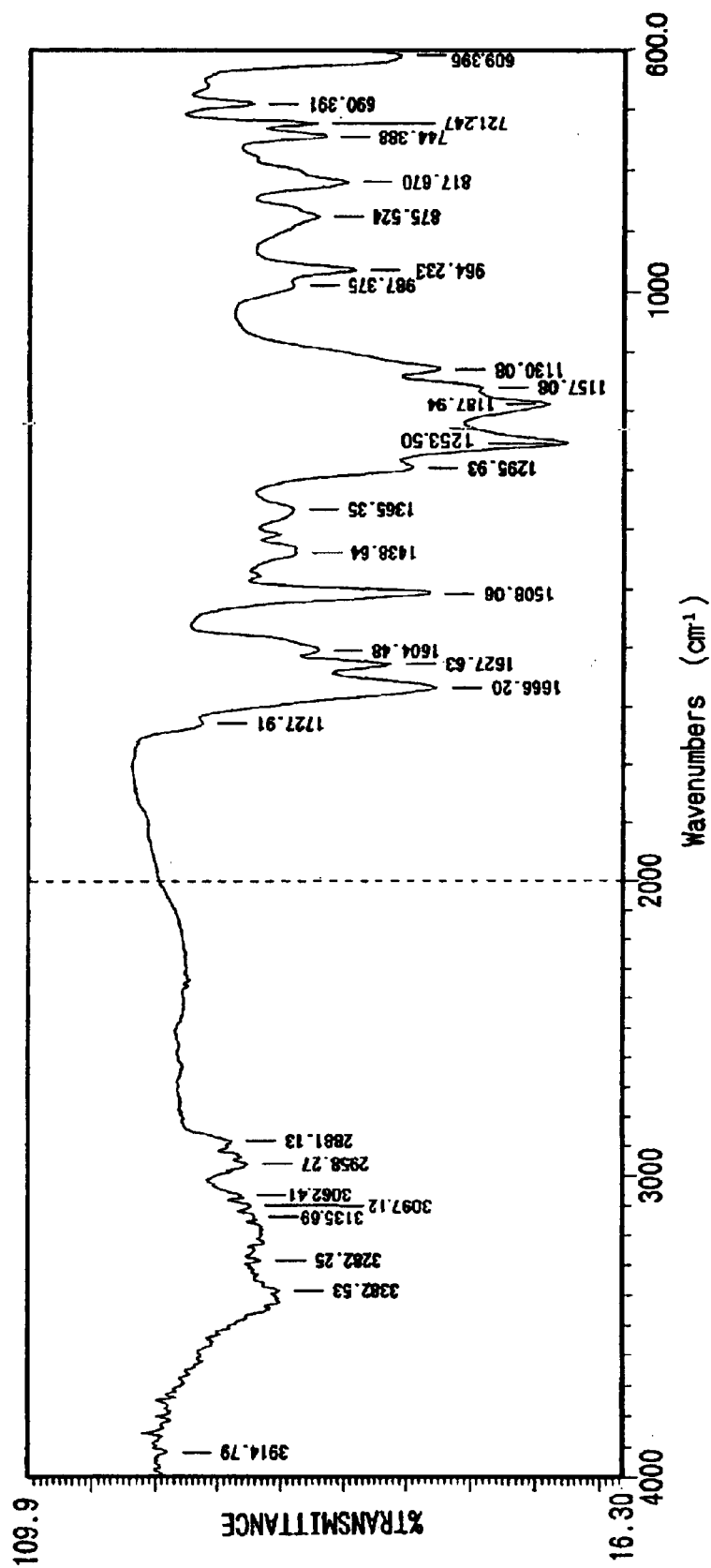
FIG. 3 shows an IR analytical chart of the polyazomethine solution (A) obtained in Example 1.

Further, the polyazomethine solution (A) obtained in Example 1 was subjected to IR analysis to obtain a chart shown in FIG. 3.

This polyazomethine solution (A) was dropped on a silicone wafer to prepare a thin film by means of a spin coater (for 30 seconds at 2,000 revolutions/minute), and the film was pre-baked at 100° C. for 5 minutes and then heated on a hot plate at 300° C. for one hour. The film thus obtained was subjected to IR analysis to obtain a chart shown in FIG. 4.

Figure 5:
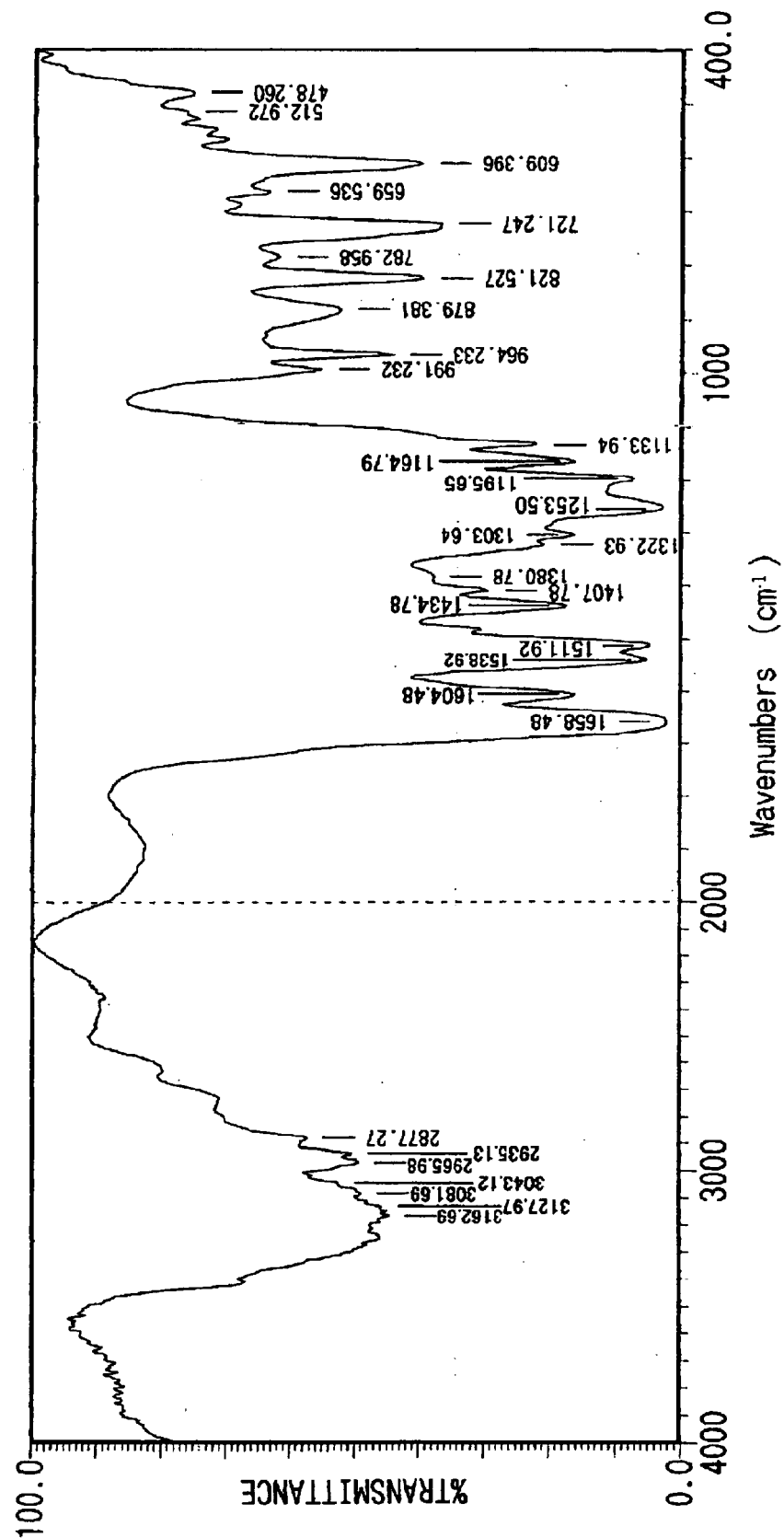
FIG. 5 shows an IR analytical chart of the polyhydroxyamide solution (C) obtained in Comparative Example 1.

Next, the polyhydroxyamide (C) synthesized in Comparative Example 1 was subjected to IR analysis to obtain a chart shown in FIG. 5.

An N-methyl-2-pyrrolidone solution (solid content: 10%) dissolving this polyhydroxyamide (C) synthesized in Comparative Example 1 was dropped on a silicone wafer to prepare a thin film by means of a spin coater (for 30 seconds at 2,000 revolutions/minute), and the film was pre-baked at 100° C. for 5 minutes and then heated on a hot plate at 300° C. for one hour. The film thus obtained was subjected to IR analysis to obtain a chart shown in FIG. 6.

Figure 4:
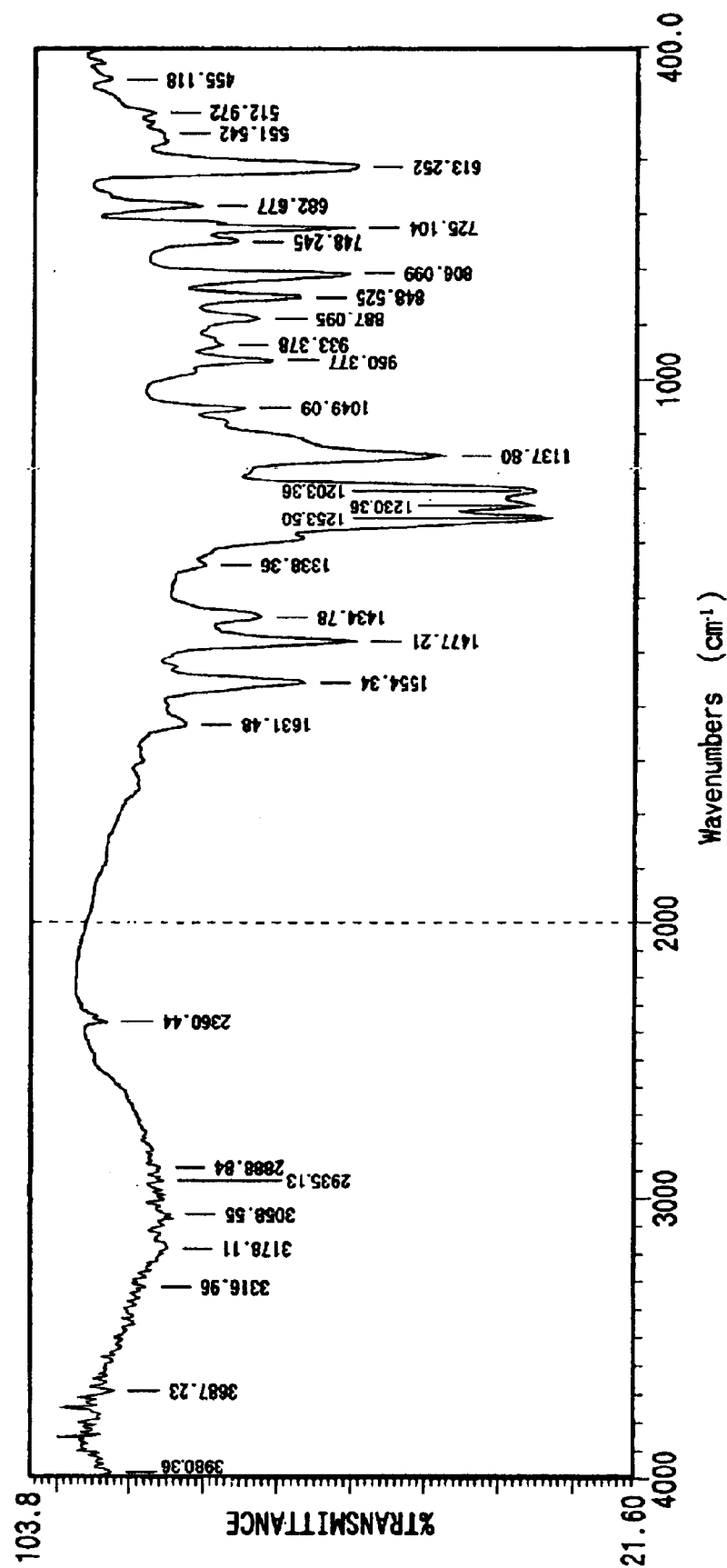
FIG. 4 shows an IR analytical chart of the film after heating which is formed from the polyazomethine solution (A) obtained in Example 1.
Figure 6:
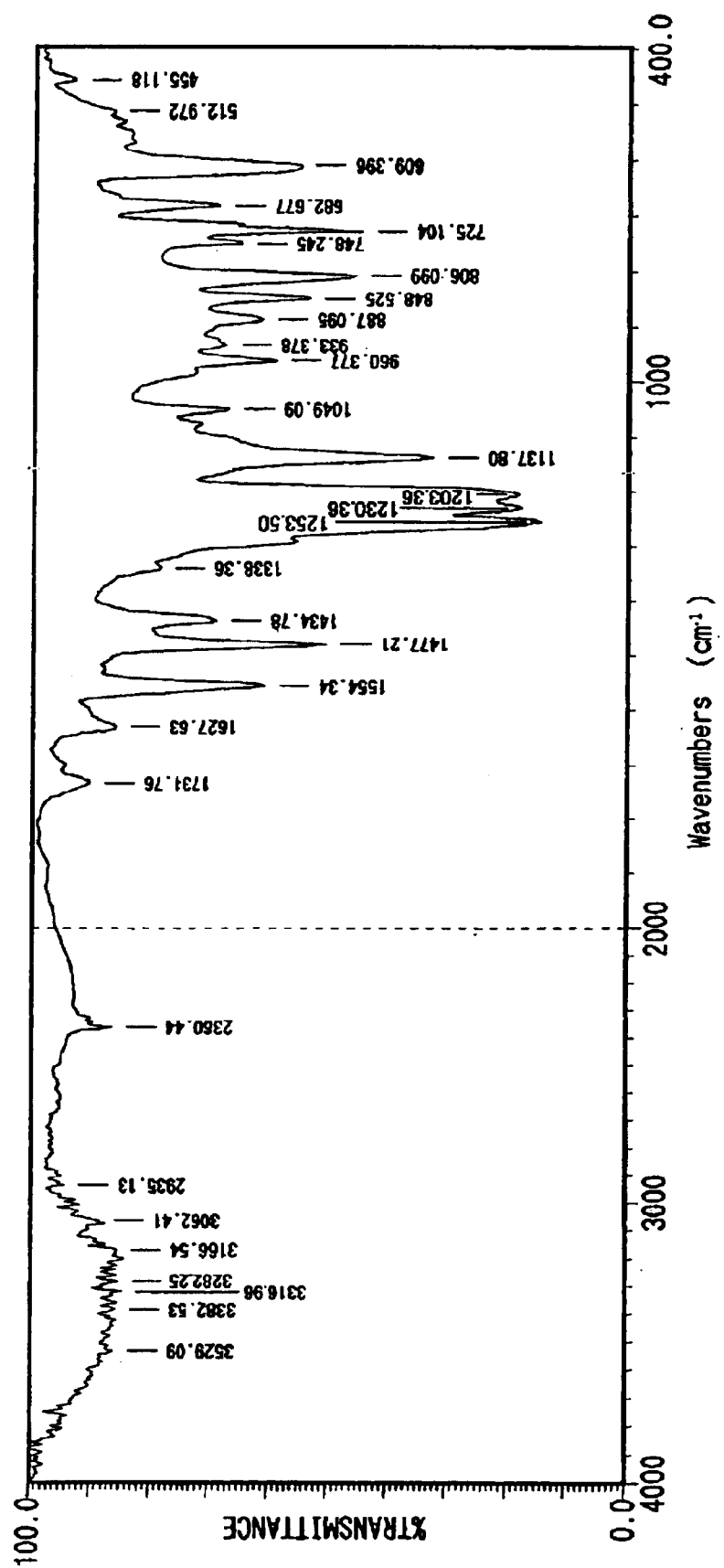
FIG. 6 shows an IR analytical chart of the film after heating which is formed from the polyhydroxyamide solution (C) obtained in Comparative Example 1.

It could be confirmed that the polybenzoxazole precursors are different in a structure since the charts shown in FIG. 3 and FIG. 5 are different in a spectrum. Further, it could be confirmed that the film obtained in Example 3 by baking is almost equal to the polybenzoxazole film obtained by baking the polyhydroxyamide prepared in Comparative Example 1 since the charts shown in FIG. 4 and FIG. 6 are consistent.

Positive Type Light-Sensitive Resin Composition

EXAMPLE 4

A sample bottle cut off from light was charged with 0.25 g of the polyazomethine solution (A) obtained in Example 1 and 0.0278 g of a quinonediazide compound (2,3,4-tris[1-oxy-2-diazonaphthoquinone-4-sulfonyl]benzophenone) and stirred for 30 minutes. Then, insoluble matters were removed through a PKFE filter of 0.5 micron to obtain a positive type light-sensitive resin composition (I).

The positive type light-sensitive resin composition (I) thus obtained was dropped on a silicone wafer, and it was subjected to slope for 5 seconds and rotated at 2,000 revolutions for 30 second by means of a spin coater. Then, it was pre-baked at 120° C. for 5 minutes to obtain a polyazomethine film having a thickness of 3.0 μm. Next, the film was covered with a pattern mask and irradiated with 300 mJ/cm² of g-line by means of a UV irradiating apparatus, and it was developed with a 2.38% tetramethylammonium hydroxide aqueous solution. As a result thereof, a good pattern having a film thickness of 2.8 μm and a width of 6 μm was obtained.

The pattern film obtained above was heated on a hot plate at 300° C. for one hour to find that the film thickness was changed to 2.1 μm and that deformation of the pattern was not observed. Further, IR analysis of the film before and after heating was carried out to find that absorption originating in polyazomethine in the vicinity of 3382 cm$^{-1}$ and 1627 cm$^{-1}$ was decreased and absorption originating in polybenzoxazole in the vicinity of 1554 cm$^{-1}$ appeared and thus it was confirmed that polyazomethine which was a precursor of polybenzoxazole was converted into polybenzoxazole.

EXAMPLE 5

The same operation as in Example 4 was carried out to obtain a good pattern having a film thickness of 3.0 μm and a width of 10 μm, except that in Example 4, the polyazomethine solution (B) prepared in Example 2 was substituted for the polyazomethine solution (A).

Further, the pattern film obtained above was heated on a hot plate at 300° C. for one hour, and IR analysis of the film before and after heating was carried out to find that similarly, polyazomethine which was a polybenzoxazole precursor was converted into polybenzoxazole.

What is claimed is:

1. A positive type light-sensitive resin composition comprising a polybenzoxazole precursor having a repetitive unit represented by Formula (1):

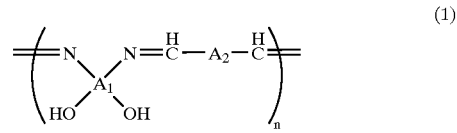

wherein $A_1$ represents a tetravalent aromatic group; N and OH which are bonded to $A_1$ are paired, and the respective pairs of N and OH are bonded to carbons which are adjacent to each other on the same aromatic ring; $A_2$ represents a divalent organic group; and n represents a number of 2 to 300, and a light sensitive quinonediazide compound.

2. The positive type light-sensitive resin composition of claim 1, wherein the polybenzoxazole precursor as set forth in claim 1, wherein $A_1$ is selected from the group consisting of:

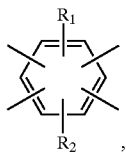 (2-1)

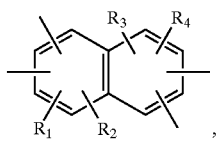 (2-2)

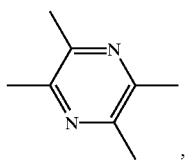 (2-3)

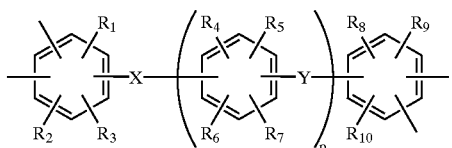 (2-4)

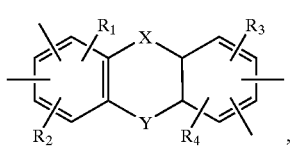 (2-5)

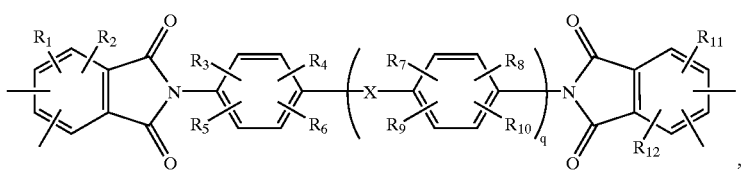 (2-6)

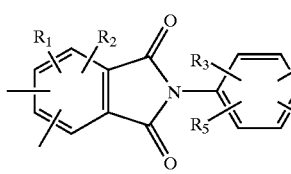

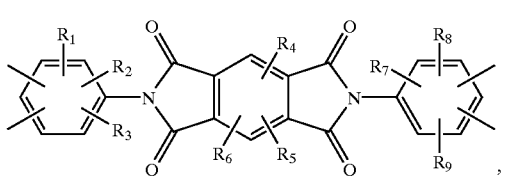 (2-7)

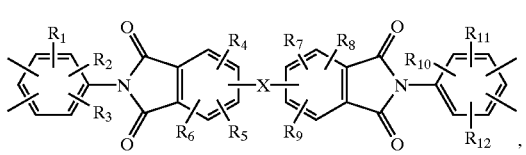 (2-8)

 (2-9)

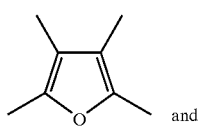 (2-10)

(2-11) and

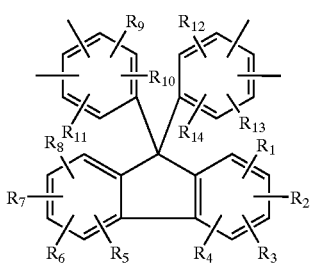 (2-12)

wherein X and Y each are selected independently from the group consisting of —CH$_2$—, —O—, —S—, —SO—, —SO$_2$—, —SO$_2$NH—, —CO—, —CO$_2$—, —NHCO—, —NHCONH—, —C(CF$_3$)$_2$—, —CF$_2$—, —C(CH$_3$)$_2$—, —CH(CH$_3$)—, —C(CF$_3$)(CH$_3$)—, —Si(R$_{21}$)$_2$—, —O—Si (R$_{21}$)$_2$—O—, —Si(R$_{21}$)$_2$—O—Si(R$_{22}$)$_2$—, —(CH$_2$)$_a$—Si (R$_{21}$)$_2$—O—Si(R$_{22}$)$_2$—(CH$_2$)$_a$— (wherein a is an integer of 0 to 6) and a direct bond; R$_1$ to R$_{14}$, R$_{21}$ and R$_{22}$ each represent independently H, F, an alkyl or alkoxyl group having 1 to 6 carbon atoms or —(CF$_2$)$_b$—CF$_3$ or —O—(CF$_2$)$_b$—CF$_3$ (wherein b is an integer of 0 to 5); and p and q each are an integer of 0 to 3.

3. The positive type light-sensitive resin composition of claim 1, wherein the polybenzoxazole precursor as set forth in claim 1, wherein A$_1$ is a group selected from the formulas (2-1) to (2-6) and (2-10) to (2-12).

4. The positive type light-sensitive resin composition of claim 1, wherein the polybenzoxazole precursor as set forth in claim 1, wherein A$_2$ is selected from the group consisting of:

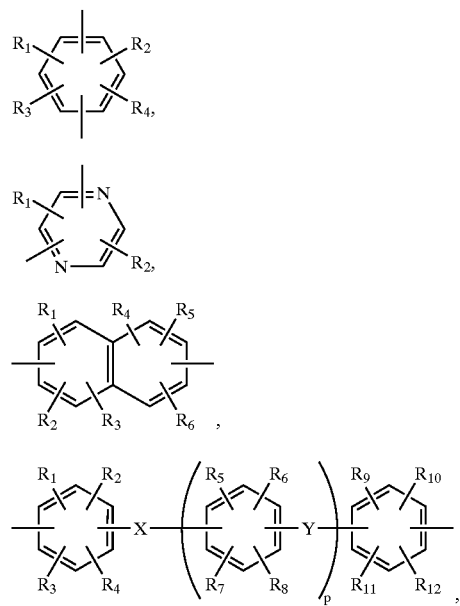
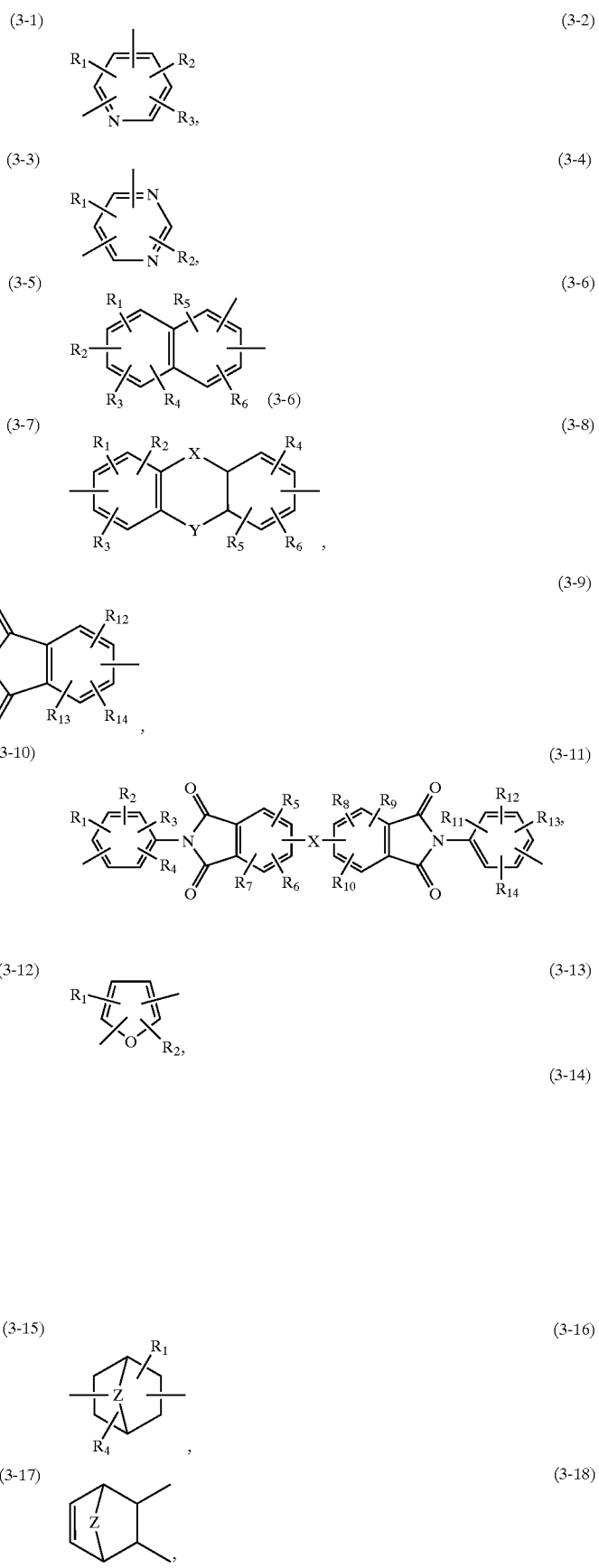

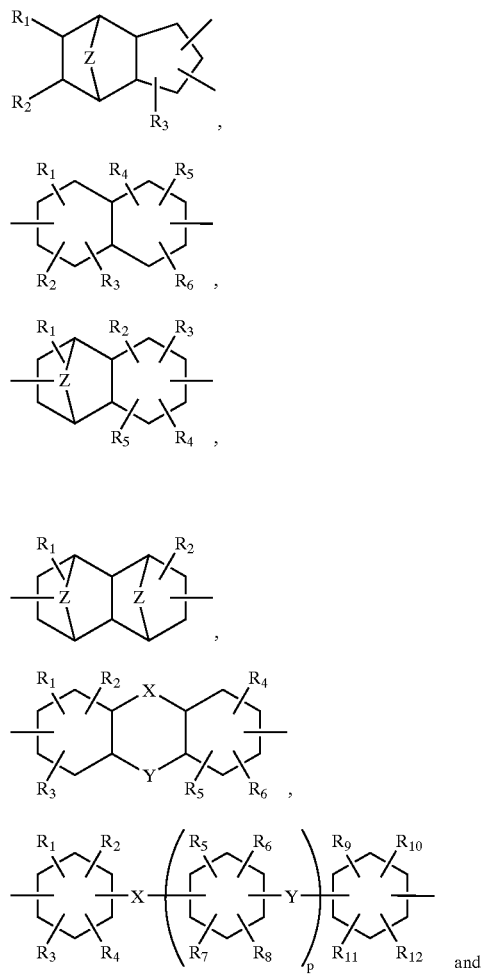

wherein X and Y each are selected independently from the group consisting of —CH$_2$—, —O—, —S—, —SO—, —SO$_2$—, —SO$_2$NH—, —CO—, —CO$_2$—, —NHCO—, —NHCONH—, —C(CF$_3$)$_2$—, —CF$_2$—, —C(CH$_3$)$_2$—, —CH(CH$_3$)—, —C(CF$_3$)(CH$_3$)—, —Si(R$_{21}$)$_2$—, —O—Si(R$_{21}$)$_2$—O—, —Si(R$_{22}$)$_2$—, —(CH$_2$)$_a$—Si(R$_{21}$)$_2$—O—Si(R$_{22}$)$_2$—(CH$_2$)$_a$— (wherein a is an integer of 0 to 6) and a direct bond; R$_1$ to R$_{16}$, R$_{21}$ and R$_{22}$ each represent independently H, F, an alkyl or alkoxyl group having 1 to 6 carbon atoms or —(CF$_2$)$_b$—CF$_3$ or —O—(CF$_2$)$_b$—CF$_3$ (wherein b is an integer of 0 to 5); Z represents —CH$_2$—, —C$_2$H$_4$— or —CH$_2$=CH$_2$—; and p and q each are an integer of 0 to 3.

5. The positive type light-sensitive resin composition of claim 1, wherein the polybenzoxazole precursor as set forth in claim 1, wherein A$_2$ is a group selected from the formulas (3-1) to (3-8), (3-12) to (3-22), and (3-25), (3-27) to (3-29).

6. A method for forming a pattern, which comprises carrying out in order a step for coating the positive type light-sensitive resin composition as described set forth in claim 1 on a substrate to form a positive type light-sensitive film on the above substrate, a step for exposing the above positive type light-sensitive film via a pattern mask and a step for developing the above exposed positive type light-sensitive film with a basic developing solution.

* * * * *